United States Patent [19]
Calligaro et al.

[11] Patent Number: 5,757,719
[45] Date of Patent: May 26, 1998

[54] PAGE-MODE MEMORY DEVICE WITH MULTIPLE-LEVEL MEMORY CELLS

[75] Inventors: Cristiano Calligaro, Torre D'Isola; Roberto Gastaldi, Agrate Brianza; Alessandro Manstretta, Broni; Paolo Cappelletti, Seveso; Guido Torelli, S. Alessio Con Vialone, all of Italy

[73] Assignee: SGS-Thomson Microelectronics S.r.l., Agrate Brianza, Italy

[21] Appl. No.: 869,208

[22] Filed: Jun. 5, 1997

[30] Foreign Application Priority Data

Jun. 5, 1996 [EP] European Pat. Off. ............ 96830318

[51] Int. Cl.$^6$ ........................................... G11C 13/00
[52] U.S. Cl. ................ 365/235; 365/189.04; 365/185.33
[58] Field of Search ........................ 365/189.04, 233, 365/185.33

[56] References Cited

U.S. PATENT DOCUMENTS 5,337,281 8/1994 Kobayashi et al. ............... 365/185.33

*Primary Examiner*—Terrell W. Fears
*Attorney, Agent, or Firm*—David V. Carlson; Bryan A. Santarelli; Seed and Berry LLP

[57] ABSTRACT

A page-mode semiconductor memory device comprises a matrix of memory cells arranged in rows and columns, each row forming a memory page of the memory device and comprising at least one group of memory cells, memory page selection means for selecting a row of the matrix, and a plurality of sensing circuits each one associated with a respective column of the matrix. The memory cells are multiple-level memory cells which can be programmed in a plurality of $c=2b(b>1)$ programming states to store b information bits, and the sensing circuits are serial-dichotomic sensing circuits capable of determining, in a number b of consecutive approximation steps, the b information bits stored in the memory cells, at each step one of said b information bits being determined, said at least one group of memory cells of a row forming a number b of memory words of a memory page.

20 Claims, 4 Drawing Sheets

PAGE-MODE MEMORY DEVICE WITH MULTIPLE-LEVEL MEMORY CELLS

TECHNICAL FIELD

The present invention relates to a page-mode memory device with multiple-level memory cells.

BACKGROUND OF THE INVENTION

Semiconductor memory devices are known which are organized in a plurality of so-called "memory pages". FIG. 1 schematically shows the structure of a conventional page-mode memory device. Memory cells MC, for example EPROM or Flash EPROM memory cells, are arranged in rows R and columns C of a memory matrix 1. Each memory cell is for example a floating gate MOS transistor having a drain electrode connected to a respective column C, a source electrode connected to ground and a control gate electrode connected to a respective row R. Each row R of the memory matrix 1 forms a memory page MP1-MPn of the memory device, and contains a number of memory cells MC equal to the number of memory words MW1-MWm of each memory page multiplied by the number of bits per each memory word (word size). For example, in the case of a memory device organized in pages of sixteen memory words of sixteen bits per word, each row R of the memory matrix 1 contains 16*16=256 memory cells. A memory page is selected when the corresponding row R of the memory matrix 1 is selected.

A line decoder circuit 2 is supplied with line address signals LADD for decoding a configuration of the line address signals and for accordingly selecting one of the rows R of memory cells of the memory matrix 1.

A plurality of sensing circuits 3 is also provided, each one associated with a respective column C of the memory matrix 1. The number of sensing circuits 3 to be provided is equal to the number of memory words per memory page, multiplied by the word size. Therefore, in the above-mentioned example, 256 sensing circuits 3 are to be provided.

A plurality of memory registers MR1-MRm is also provided for storing all the memory words MW1-MWm of a selected memory page MP1-MPn. Each memory register MR1-MRm has the same size as the size of the memory words (in the previous example, each memory register must be capable of storing sixteen bits). The plurality of memory registers MR1-MRm forms a so-called "line buffer".

A word decoder circuit 5, supplied with word address signals WADD, selects one memory word among the plurality of memory words MW1-MWm of the selected memory page MP1-MPn, and supplies the selected memory word to output buffer circuits 6 of the memory device.

A read operation of a page-mode memory device starts when one or more of the line address signals LADD change. The line decoder circuit 2 decodes the current configuration of the line address signals LADD and according to the new configuration selects one of the rows R of memory cells of the memory matrix 1. The sensing circuits 3 read the content of the memory cells MC belonging to the selected row R, and the read data are stored in the memory registers MR1-MRm. In this way, all the memory words of the selected memory page are simultaneously read and the read data are stored in the line buffer, the information content of the selected memory page being loaded in the memory registers MR1-MRm of the line buffer. The word decoder circuit 5 selects, according to the configuration of the word address signals WADD, one of the plurality of memory words of the selected memory page and transfers the content of the selected memory word to the output buffer circuits 6.

This operation takes place only when the line address signals LADD change, and takes a time equal to a conventional read operation in conventional, non-paged memory devices. Since, however, all the memory words of a memory page are simultaneously read and the read data are stored in the line buffer, each successive reading of a memory word of the same memory page is much faster, approximately one third of the read access time. In fact, in this case it is not necessary to read again the memory cells MC of the memory array 1, it being sufficient to select, by changing the configuration of the word address signals WADD, another memory register of the plurality MR1-MRm. The changing of one of the line address signals LADD causes instead a new memory page to be loaded into the line buffer. The higher the number of memory words per memory page, the higher the probability that two consecutive accesses to the memory device "hit" the same memory page.

This kind of memory devices are particularly suitable in high-speed applications requiring low read times. However, they occupy a significant chip area, due to the great number of sensing circuits which must be provided (as already mentioned, in word page-mode memory device having sixteen words and a word size of sixteen bits, 256 sensing circuits must be provided instead of the 16 required in a non-paged memory device with the same word size). As already mentioned, the number of sensing circuits is directly dependent on the word size, and on the number of memory words per memory page. Also, this kind of memory device shows a significant power consumption, because all the sensing circuits operate simultaneously.

SUMMARY OF THE INVENTION

In view of the state of the art described, it is an object of the present invention to provide a new page-mode memory device architecture which, given the memory word size and the number of memory words per memory page, allows for a reduced chip area and power consumption with respect to conventional non-paged memory devices.

According to the present invention, such object is achieved by means of a page-mode semiconductor memory device comprising a matrix of memory cells arranged in rows and columns, each row forming a memory page of the memory device and comprising at least one group of memory cells, memory page selection means for selecting a row of the matrix, and a plurality of sensing circuits each one associated with a respective column of the matrix, characterized in that said memory cells are multiple-level memory cells which can be programmed in a plurality of c=2b (b>1) programming states to store b information bits, and in that said sensing circuits are serial-dichotomic sensing circuits capable of determining, in a number b of consecutive approximation steps, the b information bits stored in the memory cells, at each step one of said b information bits being determined, said at least one group of memory cells of a row forming a number b of memory words of a memory page.

Serial-dichotomic sensing circuits for sensing, according to a serial-dichotomic method, multiple-level memory cells (i.e., memory cells which can be programmed in a plurality of programming states and which store more than one bit of information) are disclosed in the co-pending European Patent applications No. 95830023.8 and No. 95830110.3, both in the name of the same Applicant. These circuits occupy an area substantially equal to that of conventional sensing circuits for reading two-level memory cells, and have a similar power consumption.

Thanks to the present invention, it is possible to increase the number of memory words per memory page without increasing the number of sensing circuits. This allows to increase the memory capacity without significantly increasing the chip area and the power consumption of the memory device.

BRIEF DESCRIPTION OF THE DRAWINGS

These and other features of the present invention will be made more evident by the following detailed description of two particular embodiments, described as non limiting examples in the annexed drawings, wherein.

DETAILED DESCRIPTION OF THE INVENTION

Figure 1:
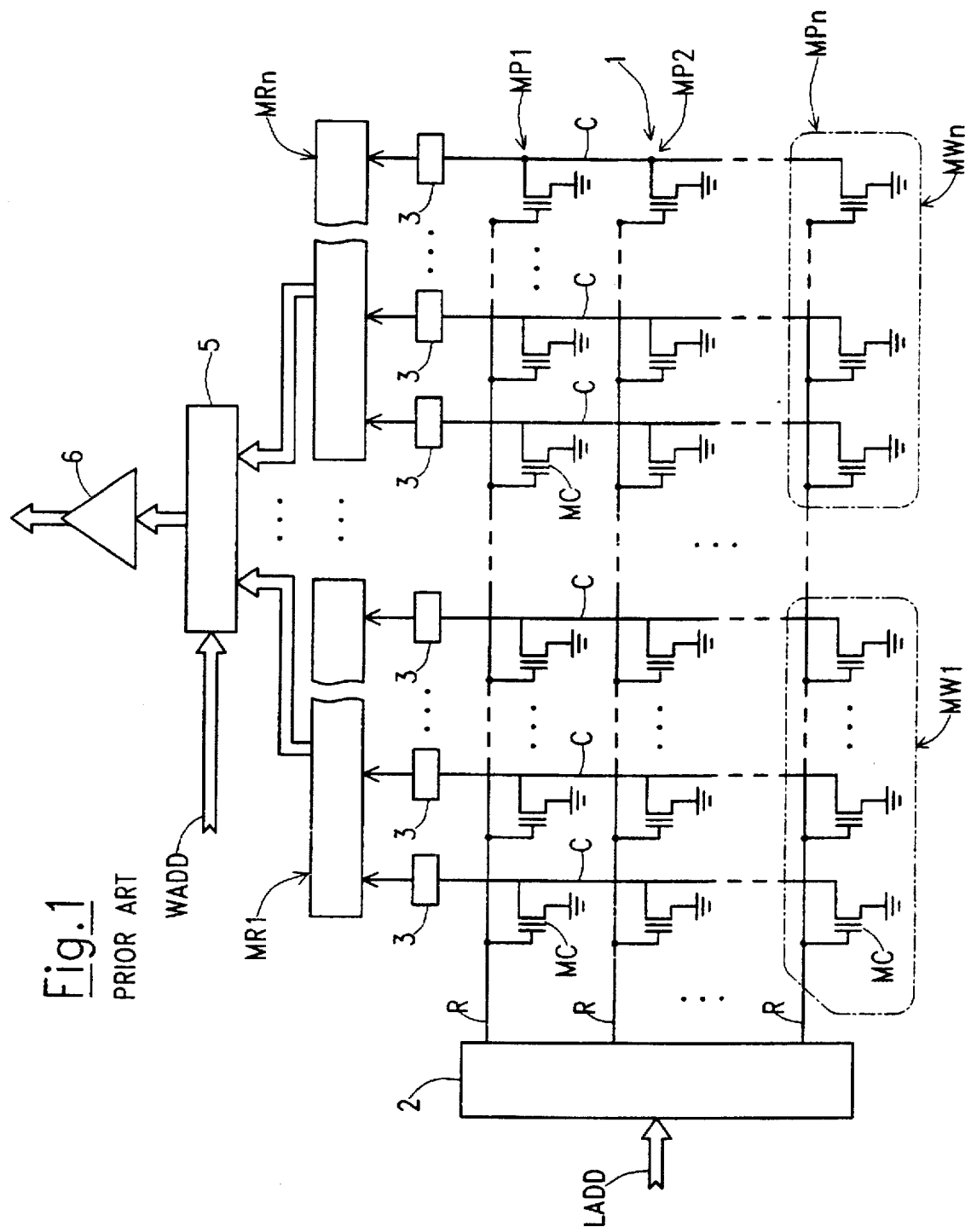
FIG. 1 schematically shows a page-mode memory device according to the prior art.

FIG. 1 schematically shows a conventional page-mode memory device, and has already been described.

Figure 2:
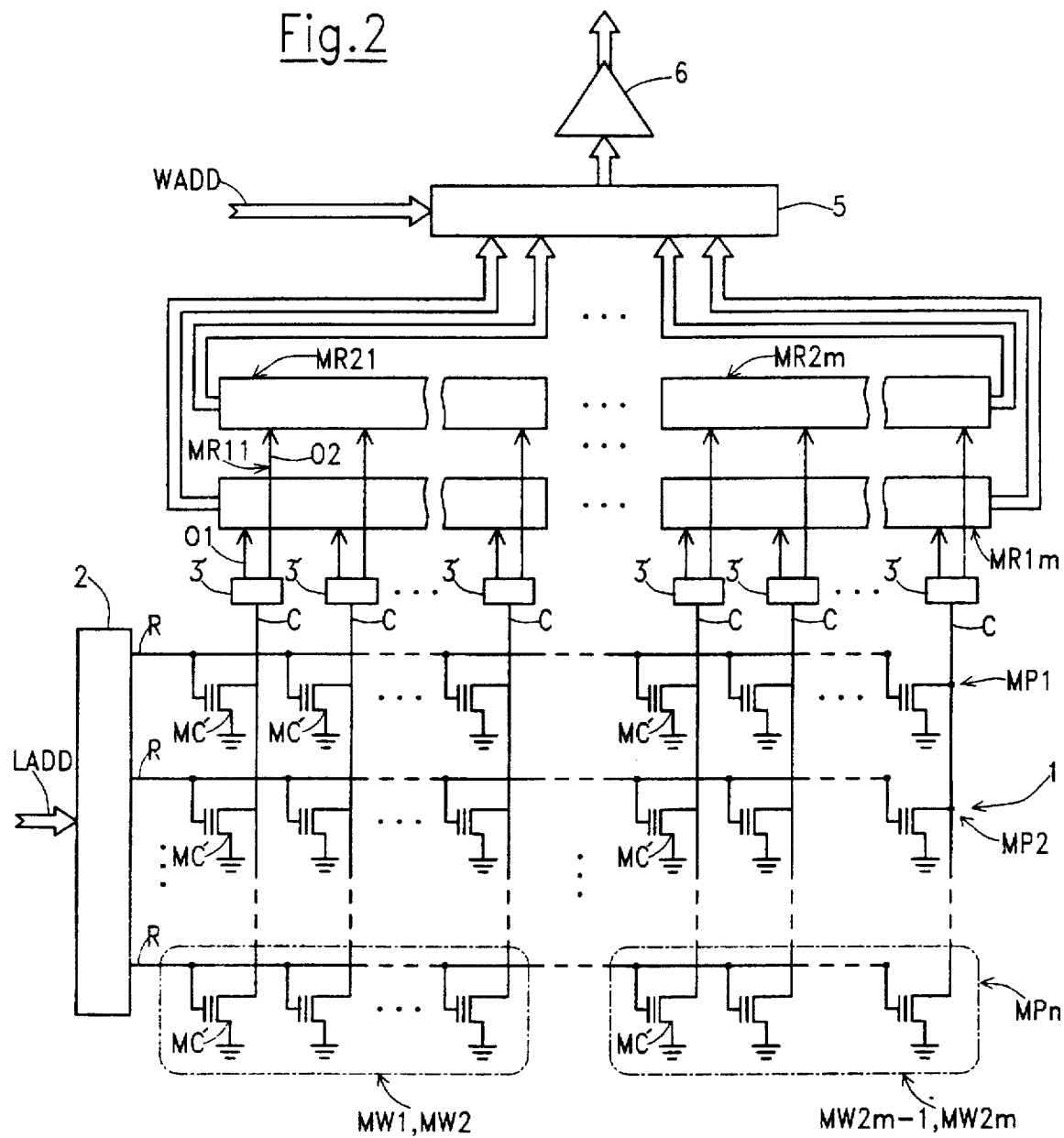
FIG. 2 schematically shows a page-mode memory device according to a first embodiment of the present invention, with four-levels memory cells.

FIG. 2 schematically shows the main circuit blocks of a page-mode memory device according to a first embodiment of the present invention.

As in conventional page-mode memory devices, a memory matrix 1 of memory cells MC' is provided, the memory cells MC' being arranged in rows R and columns C. The memory cells MC' are for example floating-gate MOS transistors of the type conventionally used in EPROM or Flash EEPROMs devices. In other embodiments, the memory cells MC' may be other types of cells, such as volatile memory cells that can store more than one data bit.

A line decoder 2 is supplied by line address signals LADD, which select one row R of the memory matrix at a time. Each row R forms a memory page MP1-MPn of the memory device.

With each column C of the memory matrix 1 there is associated a respective sensing circuit 3' for reading the information content of the memory cell MC' belonging to the selected row R.

In this embodiment of the invention, it is supposed for the sake of simplicity that each memory cell MC' is a four-level memory cell, i.e., a memory cell capable of assuming four different programming states. A four-level memory cell, differently from conventional two-level memory cells, is capable of storing two bits of information, instead of a single information bit. However this is not to be intended as a limitation of the invention, the latter providing more generally for the use of multiple-level memory cells capable of storing b bits of information.

The sensing circuits 3', differently from conventional sensing circuits used to read two-level memory cells, must be capable of discriminating the four different programming states of the memory cells.

Each sensing circuit 3' has two respective output signals O1 and O2, corresponding to the two bits of information that are stored in the memory cell MC' which is to be read. A first one O1 of the two output signals of a given sensing circuit 3' supply a respective memory unit of a memory register MR11-MR1m, and the other output signal O2 of the sensing circuit 3' supplies a respective memory unit of another memory register MR21-MR2m. Each memory register MR11-MR1m and MR21-MR2m has a size equal to the size of the memory words of the memory device. A word decoder 5, supplied with word address signals WADD, selects one memory word of the memory page, and supplies the selected word to output buffer circuits 6.

It can be seen that in the page-mode memory device according to this first embodiment of the invention, using four-level memory cells MC', the number of memory words MW1-MW2m per memory page MP1-MPn is double with respect to a conventional page-mode memory device having the same number of memory cells and the same number of sensing circuits, with a significant reduction of chip area and power consumption. This is made possible by the use of four-level memory cells instead of conventional two-level memory cells, and using sensing circuits 3' capable of discriminating the four different programming states of the four-level memory cells.

Advantageously, the sensing circuits 3' are of the type described in the co-pending European Patent Application No. 95830023.8 or in the co-pending European Patent Application No. 95830110.3, both in the name of the same Applicant, the content of which is incorporated herein by reference.

The sensing circuits 3' operate according to a serial-dichotomic sensing method which is also described in the first one of the two above-mentioned patent applications.

The serial dichotomic sensing method, applied to the sensing of a multiple-level memory cell, which can be programmed in a plurality of $c=2b$ programming states that correspond to a discrete set of cell current values, is a serial sensing method which obtains the digital code stored in the memory cell after a number b of steps independently of the particular programming state of the memory cell itself. In a first step, the cell current is compared with a first reference current having a value approximately half-way between a minimum and a maximum value of the set of cell current values, thus dividing said set of cell current values in two sub-sets to determine to which of the two sub-sets of cell current values the cell current belongs. In a second step, the cell current is compared with a second reference current having a value approximately half-way between a minimum and a maximum value of the sub-set, thus dividing the sub-set of cell current values into two further sub-sets to determine to which of the further sub-sets the cell current belongs, and so on until in the last step only two memory cell currents are left.

Figure 3:
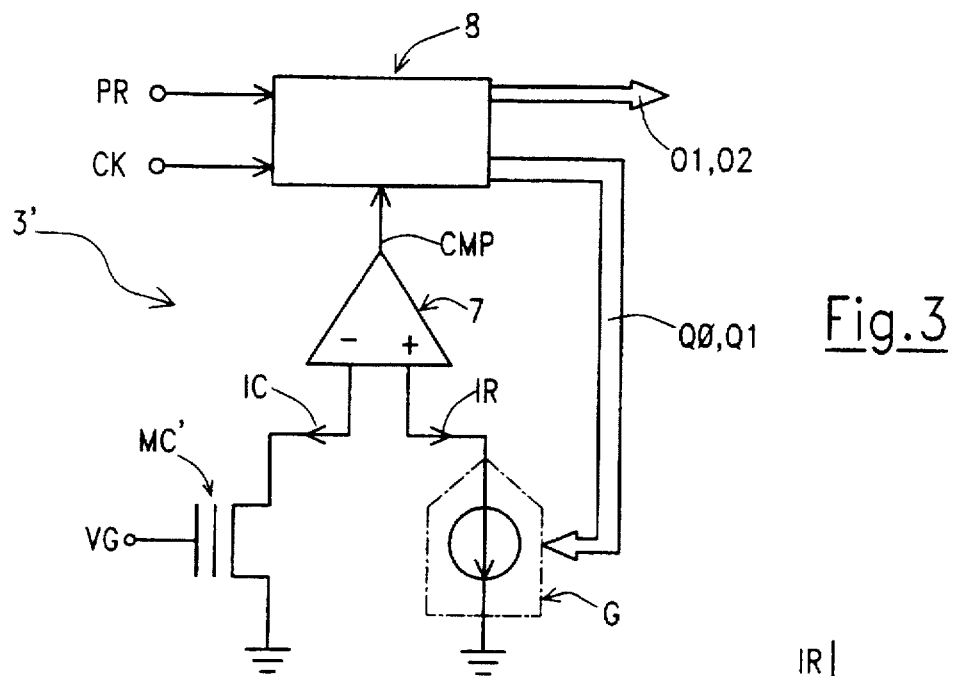
FIG. 3 schematically shows a sensing circuit of the memory device of FIG. 2.

FIG. 3 schematically shows the structure of the sensing circuits 3'. The circuit substantially comprises a digitally-driven variable reference current generator G for generating a variable reference current IR, a current comparator 7 for comparing the reference current IR generated by the variable reference current generator G with a current IC sunk by a memory cell MC' to be read (which is biased by a control gate voltage VG) and a successive approximation register 8 supplied by an output CMP of comparator 7. The successive approximation register 8 is further supplied by a preset signal PR and a timing signal CK, and generates the two output signals O1, O2 of the sensing circuit and digital control signals Q0, Q1 for the variable reference current generator G.

Figure 4:
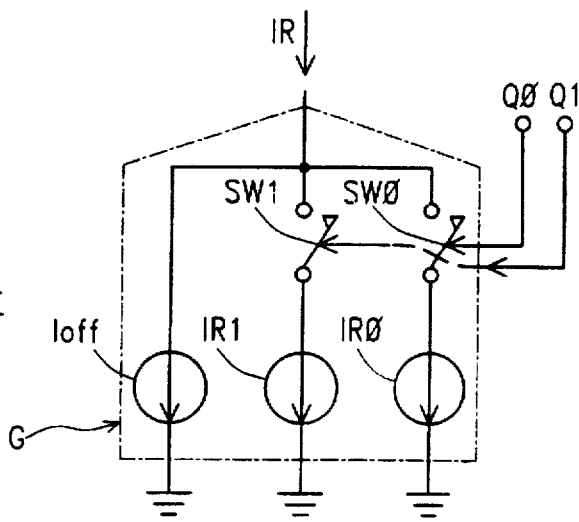
FIG. 4 schematically shows a variable reference current generator of the sensing circuit of FIG. 3.

FIG. 4 schematically shows the structure of the variable reference current generator G, which comprises three distinct reference current generators IR0, IR1 and Ioff. Ioff is an offset current generator which generates a constant current and is permanently connected to the non-inverting input of the current comparator 7. IR0 and IR1 can instead be selectively connected to the non-inverting input of current comparator 7 by means of respective switches SW0, SW1 respectively activated by the control signals Q0 and Q1.

Figure 5:
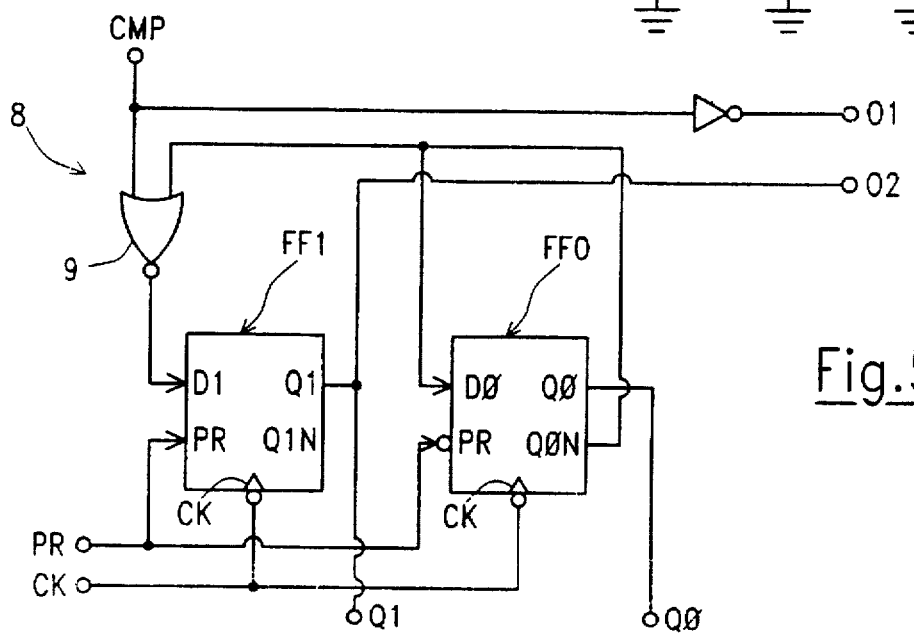
FIG. 5 shows a successive approximation register of the sensing circuit of FIG. 4.

FIG. 5 is a circuit diagram of the successive approximation register 8. The circuit comprises two delay-type flip-flops FF0, FF1, each one having a clock input CK and a preset input PR. The clock inputs CK and the preset inputs PR of flip-flops FF0, FF1 are commonly connected to the timing signal CK and to the preset signal PR (more precisely, FF0 receives the logic complement of PR, as indicated by the logic inversion dot at the input PR of FF0). Each flip-flop FF0, FF1 has a data input D0, D1, a "true" data output Q0, Q1 and a "logic complemented" data output Q0N, Q1N which is logic complement of Q0, Q1, respectively. As known, in a delay-type flip-flop the true data output after a clock pulse takes the logic value of the data input during said clock pulse. The data input D0 of flip-flop FF0 is supplied with the complemented data output Q0N of FF0 itself. The data input D1 of flip-flop FF1 is supplied with an output of a NOR gate 9 whose inputs are the output signal CMP of the current comparator 7 and the complemented data output Q0N of flip-flop FF0. The output signal CMP of the current comparator 7, once complemented, is the output signal O1 of the sensing circuit 3', and forms the least significant bit of a two-bit code stored in the memory cell MC' to be sensed; the true data output Q1 of flip-flop FF1 is the output signal O2 of the sensing circuit 3' and forms the most significant bit of said two-bit code.

The true data outputs Q0, Q1 of flip-flops FF0, FF1 are the control signals for the switches SW0, SW1 of the variable reference current generator G; switch SW0,SW1 closes when the respective control signal Q0, Q1 is a logic "1", otherwise switch SW0, SW1 is open.

The preset signal is used at the circuit power-up to assure that the starting condition of flip-flops FF0, FF1 is that corresponding to Q0="1" and Q1="0", i.e., to a reference current IR=Ioff+IR0.

Figure 6:
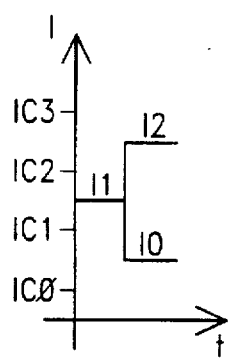
FIG. 6 diagrammatically shows the distribution of currents sunk by a four-level memory cell, and the distribution of reference currents generated by the variable reference current generator of FIG. 4.
Figure 7:
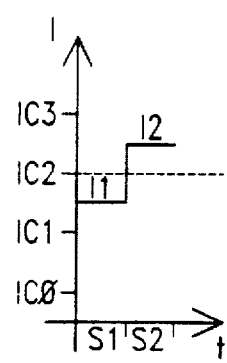
FIGS. 7 and 8 diagrammatically shows the steps of the serial-dichotomic sensing method for sensing a four-level memory cell in two different programming states.
Figure 8:
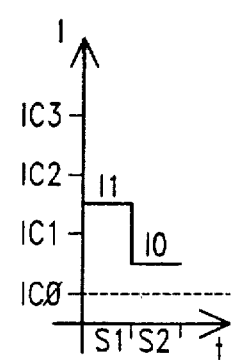

The operation of the sensing circuit 3' will be now described making reference to the diagrams of FIGS. 6 to 8.

FIG. 6 is a diagram showing, in the ordinate axis, the distribution of current values IC for a four-level memory cell to be sensed. When the memory cell is biased with a control gate voltage VG, the four different programming states correspond to four different values IC0–IC3 of the current IC sunk by the memory cell.

FIG. 6 also shows, on branches of a decision tree, the three different values I0–I2 that can be taken by the reference current IR. It is to be noted that the reference current values I0–I2 are intermediate between successive values of the memory cell current IC. I0 is equal to Ioff, I1 is equal to Ioff+IR0 and I2 is equal to Ioff+IR1.

As a first example of operation of the serial dichotomic sensing method, it is first assumed that the programming state of the memory cell to be read corresponds, once biased, to a current IC=IC2 (FIG. 7).

As previously mentioned, flip-flops FF0, FF1 are preset in a condition such that Q0="1" and Q1="0", corresponding to IR=Ioff+IR0=I1. In the first step of the sensing process, starting at the rising edge of timing signal CK current comparator 7 compares the cell current IC with the reference current I1. Since IC=IC2 is higher than I1, signal CMP="0", and on the falling edge of timing signal CK the logic state of the true data outputs Q0, Q1 changes to Q0="0" and Q1="1". This causes switch SW0 to open and switch SW1 to close, so that in the next step of the sensing process the cell current IC is compared with a reference current IR=Ioff+IR1=I2. It is to be noted that at the end of the first step of the sensing process the output signal O2 of the sensing circuit 3' already provides the correct value of the most significant bit of the two-bit code stored in the memory cell to be read. Since IC is now lower than IR, at the rising edge of signal CK signal CMP="1" and the output signal O1 of the sensing circuit, corresponding to the least significant bit of the two-bit code stored in the memory cell, is equal to "0". At the next falling edge of the timing signal CK flip-flops FF0, FF1 are automatically preset to the initial state Q0="1", Q1="0", and the sensing circuit is ready to start another sensing process.

As a second example, it is assumed that the programming state of the memory cell to be read corresponds to a current IC=IC0 (FIG. 8).

Again, the starting condition of the successive approximation register 8 corresponds to Q0="1" and Q1="0", i.e., switch SW0 closed and switch SW1 open. The reference current IR is equal to Ioff+IR1, i.e., to I1. In the first step of the sensing process, starting at the rising edge of timing signal CK current comparator 7 compares the cell current IC with the reference current I1. Since IC=IC0 is lower than I1, signal CMP="1", and on the falling edge of timing signal CK the logic state of the true data outputs Q0, Q1 changes to Q0="0" and Q1="0". This causes switch SW0 to open, so that in the next step of the sensing process the cell current IC is compared with a reference current IR=Ioff=I0. It is to be noted that at the end of the first step of the sensing process the output signal O2 of the sensing circuit 3' already provides the correct value of the most significant bit of the two-bit code stored in the memory cell to be read. Since IC is again lower than IR, at the rising edge of signal CK signal CMP="0" and the output signal O1 of the sensing circuit, corresponding to the least significant bit of the two-bit code stored in the memory cell, is equal to "0". At the next falling edge of the timing signal CK flip-flops FF0, FF1 are automatically preset to the initial state Q0="1", Q1="0", and the sensing circuit is ready to start another sensing process.

In both cases, the most significant bit O2 of the two-bit code stored in the memory cell to be read is available after the first step of the sensing process, while the least significant bit O1 of said two-bit code is available after (3/2)T from the beginning of the sensing process, where T is the period of the timing signal CK, i.e., before the end of the second step of the sensing process. Also, at the end of the second step of the sensing process the successive approximation register 8 automatically presets in the correct initial condition.

With reference to FIG. 2, when a row R of the memory matrix 1 is selected, after the first step of the sensing process the memory registers MR21-MR2m store the first m memory words of the selected memory page, and after the second step also the memory registers MR11-MRR1m store the remaining m memory words of the memory page.

Obviously, the time needed for reading the content of the 2m memory words of a memory page is higher than that necessary to read m memory words in a conventional page-mode memory device with two-level memory cells. However, twice the number of memory words are now stored in the line buffer, so that the higher time needed to load the content of a memory page in the line buffer is compensated by the fact that there is a greater probability that a subsequent access to the memory device "hits" a memory word belonging to the same memory page. The higher time necessary to load a memory page in the line buffer is thus compensated by a higher probability of high-speed accesses to the line buffer.

Figure 9:
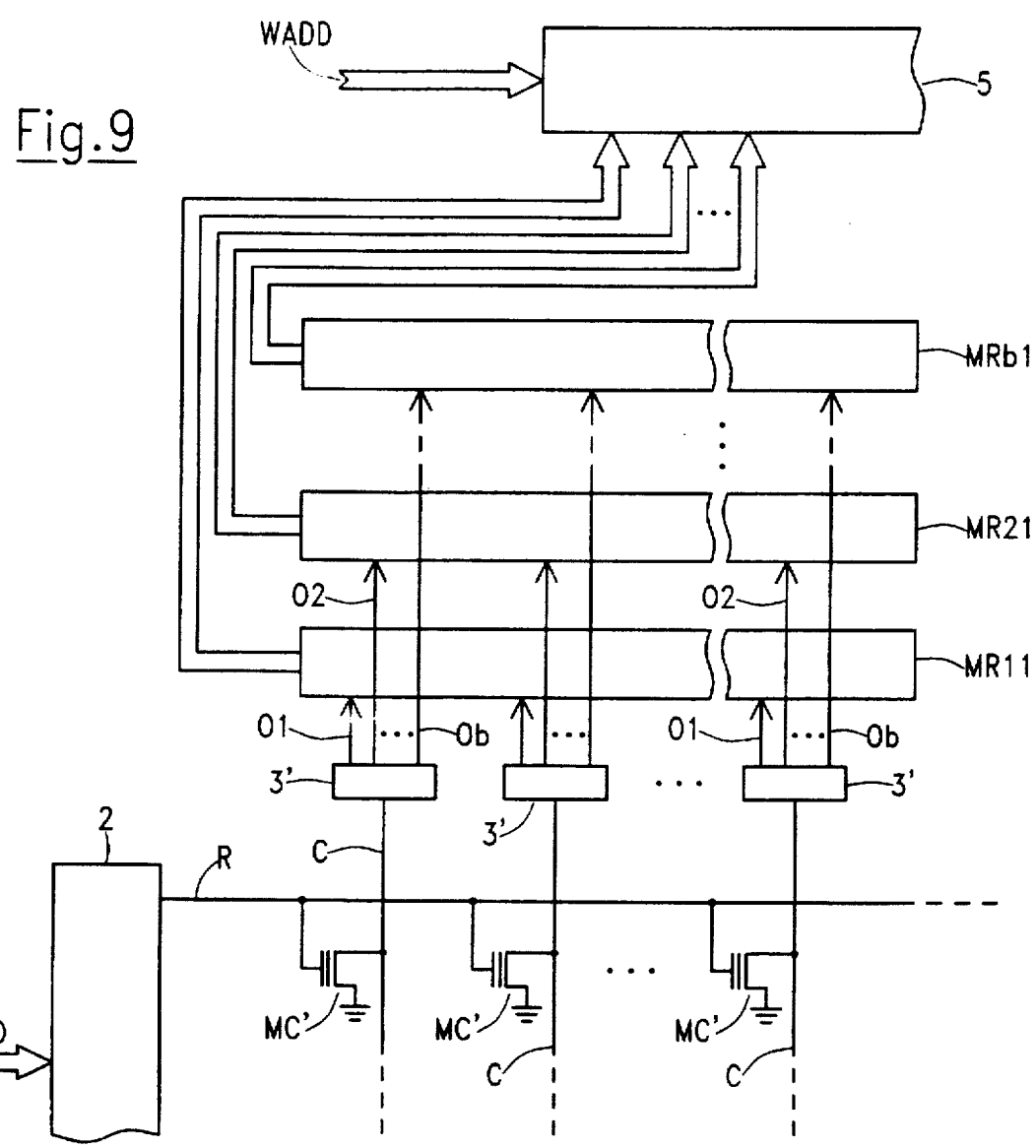
FIG. 9 schematically shows a page-mode memory device according to a second embodiment of the invention, with generally multiple-level memory cells.

FIG. 9 is a generalization of the structure shown in FIG. 2 to the case of memory cells MC' capable of being programmed in c=2b distinct states, where b is the number of information bits that can be stored in the memory cell (multiple-level memory cells).

Obviously, the sensing circuits 3' must be able of discriminating the c distinct programming states of the memory cells, and have b output signals O1-Ob. Output signal O1 supplies a respective memory unit of a first memory register MR11, output signal O2 supplies a respective memory unit of a memory register MR21, and so on, output signal Ob supplying a respective memory unit of a memory register MRb1.

It is possible to see that in this case the number of memory words per memory page is b times the number of memory words of a conventional page-mode memory device having the same number of memory cells and the same number of sensing circuits, with a great increase in the memory capacity without a corresponding increase of the chip area and of the power consumption.

As in the previous particular example relating to four-level memory cells, the sensing circuits can be advantageously of the kind suitable to implement the serial-dichotomic sensing method. The structure of the sensing circuits 3' can be easily derived by generalization from the structure shown in FIGS. 3 to 5. The number of steps required to complete a sensing process of a memory cell with c=2b different programming states is equal to b.

It should be emphasized that no limitations exist on the number b of bits that can be stored in the memory cells. Thanks to the use of a page-mode architecture, the number of bits per memory cell is not necessarily a power of 2 (2,4,8,16 ... bits per memory cell), but can be any integer number.

Finally, it should be noted that the line buffer (memory registers MR11-MR1m, MR21-MR2m) and the memory word selection circuit 5 could be eliminated, provided that the possibility of a random access to the memory words of a memory page is abandoned for a sequential reading of the memory words of the memory page. For each group (MW1, MW2)-(MW2m-31 1,MW2m) of memory cells it is necessary to provide a parallel input-serial output (PISO) memory register for generating a serial stream of bits. At each step of the serial-dichotomic sensing process, the PISO registers are loaded with new memory words of the selected memory page.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A memory circuit, comprising:

a data terminal;

an array of memory cells arranged in rows and columns, each memory cell operable to store multiple data bits;

word lines each coupled to the memory cells in a respective row;

bit lines each coupled to the memory cells in a respective column;

a row selector coupled to the word lines;

sensor circuits each coupled to a respective one of the bit lines and each having a first-bit output terminal and a second-bit output terminal;

a first line buffer having an input terminal coupled to the first-bit output terminal of one of the sensor circuits and having an output terminal, the first buffer operable to store a first data bit from a respective addressed memory cell;

a second line buffer having an input terminal coupled to the second-bit output terminal of the one sensor circuit and having an output-terminal, the second buffer operable to store a second data bit from the addressed memory cell; and a bit selector having first and second input terminals respectively coupled to the output terminals of the first and second line buffers, the bit selector having an output terminal coupled to the data line.

2. The memory circuit of claim 1 wherein each sensor circuit comprises a respective serial-dichotomic sensing circuit that is operable to sense the values of the data bits stored in a respective memory cell in a number of clock cycles that equals the number of the multiple data bits stored in a memory cell.

3. A memory circuit, comprising:

an address bus;

a data bus;

an array of memory cells arranged in rows and columns, each memory cell operable to store a number of data bits, the number greater than one, each row divided into memory words that each include a respective plurality of memory cells within the row, each memory word operable to store a number of respective data words equal to the number of data bits;

word lines each coupled to the memory cells in a respective row;

bit lines each coupled to the memory cells in a respective column;

a row selector coupled to the address bus and the word lines;

sensor circuits each coupled to a respective one of the bit lines and each having a number of bit output terminals equal to the number of data bits;

a number of line registers equal to the number of data bits, each line register having input terminals that are each coupled to a same one of the bit output terminals of a respective sensor circuit, each register having output terminals and operable to store a respective set of the data words from the memory words located in an addressed row of memory cells; and a data-word selector coupled to the address bus and having a number of sets of input terminals equal to the number of data bits, each set of input terminals respectively coupled to the output terminals of a respective line register, the data-word selector having output terminals coupled to the data bus.

4. The memory circuit of claim 3 wherein the memory cells each comprise a respective nonvolatile memory cell.

5. A memory circuit, comprising:
address bus;
a data bus;
an array of memory cells arranged in rows and columns, each memory cell operable to store a number of data bits, the number greater than one;
bit lines each coupled to the memory cells in a respective column;
a number of line buffers equal to the number of data bits, each line buffer operable to store a respective data bit from each of the memory cells in an addressed row;
sensor circuits each coupled to a respective one of the bit lines and each having a number of bit output terminals equal to the number of data bits, each bit output terminal of each sensor circuit coupled to a respective one of the line buffers, the sensor circuits operable to provide to each of the line buffers a respective data bit from each of the memory cells in the addressed row; and
a data selector coupled to the line buffers and to the address and data busses, the data selector operable to couple addressed data bits from an addressed line buffer to the data bus.

6. The memory circuit of claim 5 wherein each sensor circuit is operable to successively approximate the values of the data bits stored in a respective memory cell in the addressed row.

7. The memory circuit of claim 5 wherein each sensor circuit is operable to approximate the values of the data bits stored in a respective memory cell in the addressed row, the sensor circuit operable to approximate the values in a number of clock cycles equal to the number of data bits.

8. A method for reading data from memory cells that each store multiple data bits, the method comprising:
firing the memory cells;
sensing the data bits stored in the memory cells;
storing in a first register the data bits of a first significance that are sensed from the respective memory cells;
storing in a second register the data bits of a second significance that are sensed from the respective memory cells;
selecting one of the first and second registers; and
coupling one or more data bits from the selected register to a data bus.

9. The method of claim 8 wherein for each memory cell, the sensing comprises:
comparing a memory-cell current generated by the memory cell with a first reference current, the memory-cell current being one of a group of memory-cell currents that range from a maximum to a minimum memory-cell current, the first reference current being approximately half way between the maximum memory-cell current and the minimum memory-cell current;
in response to a result of the comparing, determining to which subgroup of memory-cell currents the memory-cell current belongs; and
repeating the comparing and determining until the subgroup includes only one memory-cell current.

10. The method of claim 8 wherein the sensing comprises sensing the data bits stored in a page of memory cells.

11. Page-mode semiconductor memory device comprising a matrix of memory cells arranged in rows and columns, each row forming a memory page of the memory device and comprising at least one group of memory cells, memory page selection means for selecting a row of the matrix, and a plurality of sensing circuits each one associated with a respective column of the matrix, wherein said memory cells are multiple-level memory cells which can be programmed in a plurality of $c=2b$ (b>1) programming states to store b information bits, and in that said sensing circuits are serial-dichotomic sensing circuits capable of determining, in a number b of consecutive approximation steps, the b information bits stored in the memory cells, at each step one of said b information bits being determined, said at least one group of memory cells of a row forming a number b of memory words of a memory page.

12. Memory device according to claim 11 wherein each row comprises a plurality of said groups of memory cells, each group forming a number b of memory words.

13. Memory device according to claim 12, further comprising a plurality of memory registers equal to the number of memory words contained in each memory page, said plurality of memory registers being divided in groups of b memory registers associated with respective groups of b sensing circuits, each sensing circuit having a number b of output signals each one supplying a respective memory unit of a respective memory register of the associated group of memory registers, each group of memory registers being loaded by the b memory words stored in a respective group of memory cells of a selected row.

14. Memory device according to claim 13, further comprising memory word selection means for selecting one among said plurality of memory registers.

15. Memory device according to claim 11, further comprising a parallel input-serial output memory register that is associated with said at least one group for storing, at each approximation step, one of the b memory words of the memory page, and for serially outputting the bits of said memory word.

16. Memory device according to claim 11 wherein each sensing circuit comprises a variable reference current generator generating a reference current which can take values intermediate to a plurality of values of a memory cell current sunk by a memory cell belonging to the column associated with the sensing circuit and with the row selected by said memory page selection means, a current comparator for comparing the memory cell current with the reference current, and a successive approximation register supplied with an output signal of the current comparator and generating control signals for the variable reference current generator.

17. Memory device according to claim 16 wherein said variable reference current generator comprises an offset current generator permanently coupled to a reference input of the current comparator, and a plurality of b−2 distinct current generators independently activatable by the successive approximation register.

18. Memory device according to claim 16 wherein the successive approximation register comprises a sequential circuit which, starting from an initial state causing the variable reference current generator to generate a reference current with value intermediate between a lowest and a highest value of the memory cell current and dichotomizing the plurality of values of the memory cell current, evolves through a succession of states each one determined by the preceding state and by the output signal of the current comparator, each state of the sequential circuit causing the variable reference current generator to generate a respective reference current with value intermediate a minimum value and a maximum value of a sub-plurality of memory cell current values to which the cell current belongs and which has been determined in the preceding step.

19. Memory device according to claim 18 wherein said sequential circuit automatically presets to said initial state after the sensing of a memory cell has been completed.

20. Memory device according to claim 19 wherein said memory cells are four-level memory cells being programmable in four different programming states to store two bits of information, said variable reference current generator comprises an offset current generator permanently coupled to a reference input of the current comparator and a first and a second selectively activatable current generators, said sequential circuit comprising a first delay-type flip-flop having a data output controlling the first activatable current generator and a data input connected to a complemented data output of the first flip-flop, and a second delay-type flip-flop having a data output controlling the second activatable current generator and a data input connected to an output of NOR logic means supplied with the complemented data output of the first flip-flop and with the output signal of the current comparator, the first and second flip-flops having timing inputs supplied by a timing signal.

* * * * *